United States Patent
Meinhardt et al.

(10) Patent No.: US 6,562,290 B2
(45) Date of Patent: May 13, 2003

(54) PROCESS FOR THE PRODUCTION OF COMPOSITE COMPONENTS BY POWDER INJECTION MOLDING, AND COMPOSITE POWDERS SUITABLE FOR THIS PURPOSE

(75) Inventors: Helmut Meinhardt, Murg (DE); Bernd Meyer, Bad Säckingen (DE); Matthias Knüwer, Bremen (DE); Dietmar Fister, Murg (DE); Wolfgang Wiezoreck, Laufenburg (DE)

(73) Assignee: H.C. Starck Inc., Newton, MA (US)

(*) Notice: Subject to any disclaimer, the term of this patent is extended or adjusted under 35 U.S.C. 154(b) by 0 days.

(21) Appl. No.: 09/932,916

(22) Filed: Aug. 20, 2001

(65) Prior Publication Data
US 2002/0068005 A1 Jun. 6, 2002

(30) Foreign Application Priority Data
Aug. 23, 2000 (DE) .......................... 100 41 194

(51) Int. Cl.$^7$ .............................. B22F 3/12; B22F 1/00
(52) U.S. Cl. ........................ 419/35; 419/19; 419/36; 419/48
(58) Field of Search ............................ 419/10, 35, 36, 419/48; 75/369

(56) References Cited

U.S. PATENT DOCUMENTS

| | | | |
|---|---|---|---|
| 3,382,066 A | 5/1968 | Kenney et al. ............ | 75/208 |
| 4,988,386 A | 1/1991 | Oenning et al. ............ | 75/247 |
| 5,468,457 A | 11/1995 | Dorfman et al. ............ | 423/61 |
| 5,470,549 A | 11/1995 | Dorfman et al. ............ | 426/61 |
| 5,641,920 A | 6/1997 | Hens et al. ............ | 75/228 |
| 5,686,676 A | 11/1997 | Jech et al. ............ | 75/247 |
| 5,905,938 A | 5/1999 | Akiyoshi ............ | 419/23 |
| 5,950,063 A | 9/1999 | Hens et al. ............ | 419/5 |
| 5,956,560 A | 9/1999 | Dorfman et al. ............ | 419/38 |
| 5,963,771 A | * 10/1999 | Chan et al. ............ | 419/2 |
| 5,993,731 A | 11/1999 | Jech et al. ............ | 419/19 |
| 6,103,392 A | 8/2000 | Dorfman et al. ............ | 428/570 |

FOREIGN PATENT DOCUMENTS

| | | |
|---|---|---|
| DE | 199 62 015 | 6/2001 |
| EP | 0 753 592 | 1/1996 |
| EP | 0 741 193 | 11/1996 |
| EP | 1 138 420 | 10/2001 |
| FR | 2 784 690 | 4/2000 |
| WO | WO/35616 | 6/2000 |

OTHER PUBLICATIONS

Proceeding 7$^{th}$ International Symp. Tungsten, Sep. 24–27, 1996, pp. 390–408 "Tungsten/copper Composites for Heat Sinks and Electrical Contacts", Dr. David L. Houck, Dr. Leonid P. Dorfman, and Dr. Muktesh Paliwal.

The International Journal of Power Metallurgy, Fol. 35, No. (month unavailable) 1999, pp. 39–48, "Powder Metallurgy Processing of Mo–Cu for Thermal Management Applications", John L. Johnson and Randall M. German.

Powder Metallurgy, vol. 44, No. 4, (month unavailable) 2001, "Enchancing thermal properties of W/Cu composites", A. Sampath, B.G. Ravi, H. Nguyen and T.S. Sudarshan, pp. 313–316.

Database Inspec [Online] Institute of Electrical Engineers, Stevenage, GB; Skorokhod V.V. et al: "Solid–phase sintering of ultrafine W(Mo)–Cu composite powders" Database accession No. 2383807 XP002196061 Zusammenfassung & Poroshkovaya Metallurgiya, Jan. 1984, Ukrainian SSR, USSR, Bd. 23, Nr. 1. Seiten 19–25, ISSN: 0032–4795.

Database Inspec [Online] Institute of Electrical Engineers, Stevenage, GB; Landau T.E. et al: "Sintering kinetics of finely divided molybdenum–copper composites" Database accession No. 3493880 XP002196062 Zusammenfassung & Poroshkovaya Metallurgiya, Sep. 1988, Ukrainian SSR, USSR, Bd. 27, Nr. 9, Seiten 13–16, ISSN: 0032–4795.

Data base Oms[ec[Online]Institute of Electrical Engineers, Stevenage, GB; Kornilova V. I. et al: "Effect of oxygen on the liquid–phase sintering of very fine tungsten–copper powder mixtures" Database accession No. 2676484 XP00219603 Zusammenfassung & Poroshkovaya Metallurgiya, Mar. 1985, Ukrainian SSR, USSR, Bd. 24, Nr. 3, Seiten 24–26, ISSN: 0032–4795.

Moon I.H. et al: "Full Densification of Loosely Packed W–Cu Composite Powders" Powder Metallurgy, Metals Society. London, GB, Bd. 41, Nr. 1, 1998, Seiten 51–57, XP000751997 ISSN: 0032–5899 Zusammenfassung.

DATABASE WPI, Section Ch, Week 7815 Derwent Publications Ltd., London, GB; Class L, p. 03, AN 1978–27489A [15] XP002188188 & JP 53 021014 A (TDK Electronics Co Ltd), Feb. 27, 1978. Zusammenfassung.

\* cited by examiner

Primary Examiner—Ngoclan Mai
(74) Attorney, Agent, or Firm—Godfried R. Akorli; Diderico van Eyl

(57) ABSTRACT

The invention relates to a process for the production of metallic and metal-ceramic composite components by powder injection molding of a system comprising a metal composite powder, a binder and optionally a ceramic component, where the metal composite powder used is mixed with a protecting liquid in an inert atmosphere before the mixing with the binder. The invention furthermore relates to molybdenum/copper and tungsten/copper composite powders which have a primary metal particle size of predominantly <2 μm, an oxygen content of <0.8% by weight and optionally a ceramic component, to the use of these composite powders for the production of composite components by powder injection molding, and to a process for the preparation of composite powders in which oxides of molybdenum or tungsten and of copper are mixed, dry-ground and reduced using hydrogen at a temperature of from 800 to 1050° C., and a ceramic component is optionally admixed with the resultant metal composite powder.

13 Claims, 1 Drawing Sheet

PROCESS FOR THE PRODUCTION OF COMPOSITE COMPONENTS BY POWDER INJECTION MOLDING, AND COMPOSITE POWDERS SUITABLE FOR THIS PURPOSE

BACKGROUND

The present invention relates to a process for the production of metallic and metal-ceramic composite components from composite powders, in particular based on molybdenum/copper and tungsten/copper, by powder injection molding (PIM). The invention furthermore relates to molybdenum/copper and tungsten/copper composite powders having a low primary metal particle size and optionally containing ceramic additives, to their preparation, and to their use for the production of composite components.

Metallic and metal-ceramic composite materials are widely used as special materials, for example in plant, apparatus and equipment construction. Tungsten/copper and molybdenum/copper composite materials are employed in various electrical and electronic applications owing to their comparatively high thermal conductivity. For example, these materials are increasingly being used for various applications in information, communications and transport technology as so-called "heat sinks", "heat spreaders" and "packagings". In addition, components made from composite materials based on tungsten/copper or molybdenum/copper are employed as electrical contacts, spot-welding electrodes, for electro-discharge machining, for power switches and for commutator materials owing to their good conductivity and high wear resistance.

For the production of composite components, various processes are known, particular importance being ascribed to powder injection molding (PIM). In this process, a suitable powder mixture comprising the desired metals and optionally further additives is mixed with a so-called binder. This mixture is homogenized, compressed, debindered and sintered.

The quality of the resultant composite components is crucially affected by the quality and composition of the composite powder employed or of the composite powder/binder mixture. Composite powder/binder mixture is also referred to as the feedstock. In particular in the case of processing of composite powders based on tungsten/copper and molybdenum/copper, it is difficult to obtain composite components with densities which are close to the theoretically possible density. It is likewise problematic to maintain tolerance values of ±0.1% for the component dimensions.

U.S. Pat. No. 5,993,731 and U.S. Pat. No. 5,686,676 propose producing metal composite components, in particular tungsten/copper and molybdenum/copper composite components, by metal powder injection molding, where, besides metal, the component subjected to the sintering process also contains chemically bound oxygen, for example in the form of metal oxides. Oxygen must be present in sufficient amount in the mixture in order to improve the sintering properties of the mixture. The sintering is carried out in a reducing atmosphere, with the oxygen present being removed little by little as far as a technically possible minimum value. According to the examples, tungsten/copper and molybdenum/copper composite components having a density which corresponds to about 98% of the theoretical density can be obtained in this way. However, it is problematic here that the composite components still contain relatively large amounts of oxygen in the form of metal oxides before the sintering. Oxygen remaining in the component is dissolved in the copper lattice during conventional liquid-phase sintering and can thus have an adverse effect on the component properties. It is not ensured that the oxygen present in the starting mixture is virtually completely degraded in this process and does not diffuse into the copper structure.

U.S. Pat. No. 5,905,938 describes a process for the production of tungsten/copper and molybdenum/copper composite components starting from tungsten and/or molybdenum powder having a particle size of up to 1 $\mu$m and copper powder having a particle size of up to 7 $\mu$m. The copper powder can also be replaced by copper oxide powder, where the copper oxide must be reduced during the sintering. In order to improve the sintering behaviour, metals from the iron group (Fe, Co and Ni) and phosphorus must be added. This pressure has the disadvantage that it is again not ensured that the composite component is substantially oxygen free. In addition, the cell conductivity of the copper matrix is significantly reduced even by small proportions of iron, cobalt or nickel.

U.S. Pat. No. 5,950,063 and U.S. Pat. No. 5,641,920 disclose various ways of preparing starting mixtures which are particularly suitable for further processing by powder injection molding. Thus, it is proposed to mix the individual components of the binder in an inert atmosphere. The mixing of binder and powder system should also be carried out in an inert atmosphere. This prevents components of the binder of low molecular weight being oxidatively decomposed. However, it is not pointed out that it could be advantageous to protect the powder system against contact with oxygen, in particular through the addition of a protecting liquid, even before the mixing with the binder.

In the processes described for the production of metal composite components by metal powder injection molding, metal powder/binder mixtures which, besides the metals, also contain oxygen are processed. The presence of oxygen is problematic, since it can dissolve in the metal lattice during sintering. In the case of molybdenum/copper and tungsten/copper composite components, the oxygen dissolved in the copper lattice results in an undesired decrease in the thermal conductivity.

The object of the present invention was to provide a process for the production of metallic and metal-ceramic composite components, in particular based on molybdenum/copper and tungsten/copper, by powder injection molding with which composite powders can be converted in a simple manner into high-quality products. A further object was to provide composite powders based on molybdenum/copper and tungsten/copper which are particularly suitable for processing by powder injection molding.

SUMMARY

The invention relates to a process for producing a composite component comprising: (a) mixing a metal composite powder with a protecting liquid in an inert atmosphere, (b) mixing the metal composite powder formed in step (a) with a binder and forming a system comprising the metal composite powder and the binder, and (c) subjecting the system to powder injection molding and forming the composite component.

The invention also relates to a process for producing a composite component comprising: (a) producing a metal composite powder by reduction of oxides of at least two different metals with hydrogen, (b) mixing the metal composite powder with a protecting liquid in an inert atmosphere and forming a metal composite powder product, (c) mixing the metal composite powder product of step b) with a binder and forming a composite powder/binder mixture, and (d) subjecting the composite powder/binder mixture to injection-molding and forming the composite component.

The invention also relates to a molybdenum/copper composite powder comprising a primary metal particle size of predominantly less than about 2 μm and an oxygen content of less than about 0.8% by weight.

The invention also relates to a tungsten/copper composite powder comprising a primary metal particle size of predominantly less than about 2 μm and an oxygen content of less than about 0.8% by weight.

In one embodiment, the invention relates to a process for forming a molybdenum/copper composite powder comprising a primary metal particle size of predominantly less than about 2 μm and an oxygen content of less than about 0.8% by weight, the process comprising: (a) mixing oxides of molybdenum and of copper and forming a mixture, and (b) dry-grounding and reducing the mixture with dry hydrogen at a temperature ranging from about 800 to about 1050° C. and forming the composite powder.

In another embodiment, the invention relates to a process for forming a tungsten/copper composite powder, wherein it has a primary metal particle size of predominantly less than about 2 μm and an oxygen content of less than about 0.8% by weight, the process comprising: (a) mixing oxides of tungsten and of copper and forming a mixture, (b) dry-grounding and reducing the mixture with dry hydrogen at a temperature of from about 800 to about 1050° C. and forming the composite powder.

DESCRIPTION OF THE FIGURES

These and other features, aspects, and advantages of the present invention will become better understood with reference to the following description and appended claims, where

DESCRIPTION

Figure 1:
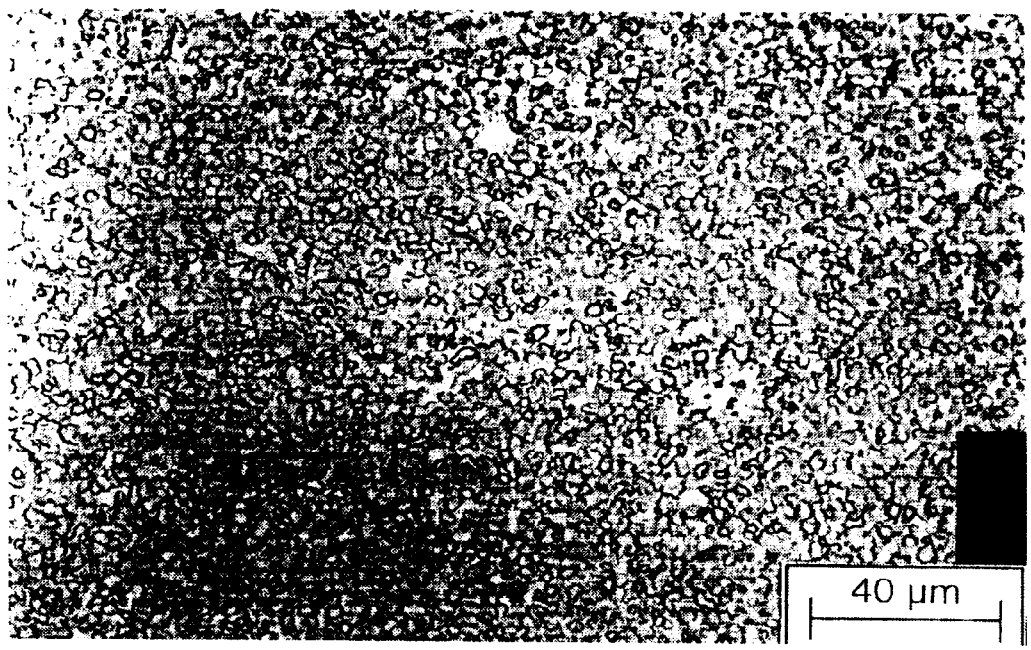
FIG. 1 is a picture of samples prepared in accordance to the invention.

The invention relates to a process for the production of composite components by powder injection molding of a system comprising a metal composite powder and a binder, which is characterized in that the metal composite powder is mixed with a protecting liquid in an inert atmosphere before the mixing with the binder.

In a particular embodiment of the process according to the invention, a ceramic component is added to the metal composite powder. The addition of the ceramic component can take place before or after the mixing with the protecting liquid. The composite components formed are then metal-ceramic composite components.

The invention furthermore relates to a process for the production of composite components which comprises the following steps:

a) production of a metal composite powder by reduction of oxides of at least two different metals using hydrogen, b) mixing of the metal composite powder with a protecting liquid in an inert atmosphere, c) optionally addition of a ceramic component, d) mixing of the product with a binder, e) injection-molding of the resultant composite powder/binder mixture.

If desired, not only the oxides of the metals of which the desired composite component is essentially composed, but also simultaneously further metal compounds whose metal component acts as sintering additive during later further processing to the composite component may be reduced in step a).

The water content of the hydrogen employed should be as low as possible.

It must be ensured in the process according to the invention that the metal composite powder is substantially protected against contact with oxygen from the point in time of its preparation to the point in time at which the mixing with the protecting liquid has taken place.

The process according to the invention is distinguished by the fact that, in a surprising manner, metallic and metal-ceramic composite components are obtained which have a very low content of oxygen dissolved in the metal lattice. Even without addition of sintering additives, high component densities and thus also very good mechanical component properties can be obtained. The sintering can be carried out at comparatively low temperatures, which reduces the risk of the component deforming during the sintering operation. Very narrow tolerance limits for the component geometry can thus be observed.

In the process according to the invention, a multiplicity of metal composite powders comprising two or more different metals can be employed. Suitable, for example, are metal composite powders which comprise firstly one or more metals from the group consisting of copper, nickel, iron, chromium, zinc, tin, beryllium, antimony, titanium, silver, cobalt, aluminium, rhenium and niobium and secondly one or more metals from the group consisting of tungsten, molybdenum and tantalum. Further elements, for example boron or silicon, or element combinations are not excluded by this list. The elements can also partially be in the form of nanopowders, for example as powders having a mean particle diameter of less than about 100 nm.

Preference is given to metal composite powders which comprise firstly one or more metals from the group consisting of copper, nickel, iron and cobalt and secondly molybdenum and/or tungsten, particularly preferably those which comprise firstly copper and secondly molybdenum and/or tungsten.

Particular preference is given to molybdenum/copper and tungsten/copper composite powders which have a primary metal particle size of predominantly less than about 2 μm and an oxygen content of less than about 0.8% by weight, preferably less than about 0.5% by weight, particularly preferably less than about 0.3% by weight. Composite powders of this type are likewise a subject-matter of the invention. At least about 90% of the metal primary particles preferably have a size of less than about 2 μm, the primary metal particle size being determined by image analysis of a scanning electron photomicrograph of a composite powder.

On use of the molybdenum/copper or tungsten/copper composite powders according to the invention, components of complex shape with particularly high density and dimensional tolerances can be obtained. This is particularly true in the presence of sintering-promoting metal additives and stable ceramic particles, since the ceramic particles present contribute to reducing internal stresses and thus additionally to reducing warpage of components of this type.

A further advantage of the use of molybdenum/copper or tungsten/copper composite powders of this type is that the sintering can be carried out at relatively low temperatures, for example, at temperatures of from about 1090 to about 1300° C. This is facilitated, in particular, by the low oxygen content, but also by the small particle size of the metallic fractions.

In spite of the low sintering temperature, the resultant composite components are distinguished by excellent microhomogeneity and density. The density is preferably more than about 98%.

Suitable ceramic components which may be mentioned for the production of metal-ceramic composite materials are borides, for example titanium boride, oxides, such as, for example, niobium oxide, titanium oxide and aluminium oxide, nitrides, for example aluminium nitride and silicon nitride, carbides and silicides, although other ceramic components are also possible. The ceramic components may be a single constituent, but may also be a mixture of various constituents. The constituents of the ceramic component may also be in the form of a nanopowder.

The ceramic component used is preferably aluminium nitride, in particular aluminium nitride powder having a mean particle diameter of less than about 10 μm.

The oxygen incorporated into the desired metal-ceramic composite component in the form of oxidic ceramic components is not crucial, in contrast to the oxygen introduced via the metallic components, and does not migrate into the lattice of the metal component of the composite component during the sintering, since only oxidic ceramic components which are thermodynamically stable at the conventional sintering temperatures are employed.

Oxidic ceramic components can be fed to the metal composite powder even during its preparation. However, the ceramic component is advantageously admixed with the metal composite powder after production of the latter.

In accordance with the invention, the composite powder is mixed with a protecting liquid in an inert atmosphere, for example in the presence of argon and/or nitrogen. Protecting liquid here is taken to mean a liquid which protects the composite powder against contact with oxygen during further processing and is not harmful to the organic binder later to be admixed.

If it is intended to produce metal-ceramic composite components, it is possible firstly to admix the ceramic component with the metal composite powder and then to treat the resultant metal-ceramic composite powder with the protecting liquid. Preferably, however, the metal composite powder is firstly mixed with the protecting liquid, and the ceramic component is only added subsequently.

Examples of suitable protecting liquids are organic solvents in which oxygen is very poorly soluble. Examples which may be mentioned are hexane, heptane, toluene and mixtures thereof. Preferably, a wax component which is soluble in the solvent is added to the organic solvent. During later evaporation of the protecting liquid, the conditions are preferably selected in such a way that the wax component remains and forms an impermeable protective film on the composite powder. Through the fact that the wax component is initially in dissolved form, even small interspaces and pores of the composite powder are filled by the protecting liquid. Here too, an impermeable protective film of the added wax component can subsequently form on evaporation of the protecting liquid.

The wax component can be, for example, a constituent of the binder later used which is soluble in the organic solvent employed. Examples of suitable wax components which may be mentioned are paraffin, beeswax and carnauba wax.

The amount of protecting liquid employed is only crucial inasmuch as it must be ensured that the surface of the particles of the composite powder is covered with protecting liquid.

The addition of the protecting liquid prevents oxygen take-up by the composite powder, which could significantly reduce the sintering activity. In addition, possible agglomeration of the composite powder, which would result in undesired pore formation in the composite component produced therefrom, is substantially suppressed.

The mixture of composite powder and protecting liquid is, in accordance with the invention, mixed with a binder, in particular a pulverulent binder.

Suitable binders are known to the person skilled in the art. They are generally multicomponent, organic systems, for example based on polyethylene wax. The binders employed in industry are mainly thermoplastic binders. Thermoplastic binders comprise, for example, in various concentrations, paraffin, carnauba wax, beeswax, polyethylene wax and/or vegetable oils as the principal constituent, polyethylene, polypropylene, polystyrene and/or polyamide as thermoplastic, and stearic and oleic acid and esters thereof and/or phthalic acid esters as additives. In addition, thermosetting and gelling binders are also used in industry.

The addition of the binder serves primarily for shaping during powder injection molding. Only the fraction of the binder having the highest melting point is necessary for holding the composite powder/binder mixture together before commencement of sintering.

The mixing of binder and the mixture of composite powder and protecting liquid is advantageously carried out at temperatures of from about 1100° C. to about 200° C. During this process, the protecting liquid evaporates or is integrated into the binder.

The mixing process can be carried out without the presence of a protective gas, since the protecting liquid prevents undesired contact of the composite powder with oxygen. However, the use of protective gas during this operation is not excluded.

The mixing operation can be carried out, for example, in suitable compounding devices.

The composite powder/binder mixture (feedstock) obtained can be further reacted in a manner known per se for the production of composite components by powder injection molding. For example, the feedstock can be pre-homogenized in a suitable unit, for example a compounder or extruder. For the use of a shear roll extruder, possible agglomerates in the feedstock can be substantially destroyed and the requisite good microhomogeneity of the feedstock set. The composite powder/binder mixture pretreated in this way can be converted into granules in a manner known per se, which can be converted into a composite molding by compaction, debindering and sintering.

If the composite powder/binder mixture comprises aluminium, it is reacted in a corresponding sintering atmosphere, i.e. is converted into aluminium nitride in the case of sintering in a nitrogen atmosphere. In this case, a ceramic component thus forms on sintering.

The invention furthermore relates to molybdenum/copper and tungsten/copper composite powders which have a primary metal particle size of predominantly less than about 2 μm and a content of oxygen dissolved in a metal lattice of less than about 0.8% by weight, to the use of this composite powder for the production of composite components by powder injection molding, and to a process for the preparation of the composite powders.

The composite powders according to the invention are distinguished by high sintering activity and are therefore excellently suitable for the production of composite components, in particular by the process according to the invention described above. A further advantage is that the composite powders are substantially free from agglomerates.

At least about 90% of the primary metal particles of the composite powders according to the invention preferably have a size of less than about 2 μm, the primary metal particle size being determined by image analysis of a scanning electron photomicrograph of the composite powder.

The composite powders according to the invention preferably have a content of oxygen dissolved in the metal lattice of less than about 0.5% by weight, particularly preferably less than about 0.3% by weight.

The molybdenum/copper and tungsten/copper composite powders according to the invention optionally contain a ceramic component. Suitable ceramic components are, for example, constituents as already mentioned above.

The molybdenum/tungsten:copper weight ratio can vary within broad ranges and is, for example, from about 90:10 to about 10:90, preferably from about 90:10 to about 30:70, particularly preferably from about 90:10 to about 50:50.

If a ceramic component is present, the molybdenum/tungsten:copper weight ratio is, for example, from about 90:10 to about 10:90, preferably from about 90:10 to about 30:70, particularly preferably from about 90:10 to about 50:50, and the proportion by weight of ceramic components in the metal/ceramic composite powder is, for example, from about 0.1 to about 40% by weight, advantageously from about 1 to about 10% by weight.

The molybdenum/copper or tungsten/copper composite powder according to the invention can be prepared, for example, starting from oxides of molybdenum or tungsten, for example $MoO_2$ or $WO_3$, and of copper, for example CuO. The oxides are dry-ground in order to achieve the smallest possible particle size. The grinding is advantageously carried out in a fluidized-bed counterjet mill. Impurities due to abrasion of grinding beads or housing walls are thereby avoided. After the grinding, the oxides are, for example, dry-mixed and homogenized in a manner known per se.

The homogenized mixture is reduced in the presence of hydrogen at a temperature ranging from about 800 to about 1050° C., preferably at from about 850 to about 950° C., which causes the oxygen content to be reduced to the amount according to the invention.

Any desired ceramic component can subsequently be admixed. However, it is also possible to add the ceramic component even before preparation of the molybdenum/copper or tungsten/copper composite powder.

The invention is further described in the following illustrative examples in which all parts and percentages are by weight unless otherwise indicated. As such, the invention is not restricted to the examples.

EXAMPLES

Example 1

In order to prepare a molybdenum/copper composite powder or feedstock having an Mo:Cu weight ratio of 70:30, a mixture of 71% by weight of $MoO_2$ and 29% by weight of CuO was dry-ground in the counterjet mill and subsequently reduced at 850° C. under dry hydrogen. The total oxygen content was 0.40% by weight. 2000 g of the molybdenum/copper composite powder were subsequently stirred under nitrogen into 650 ml of hexane to which 50 g of paraffin wax had been added. As binder for the preparation of the feedstock, a wax/polymer mixture was added in the heatable Sigma compounder. The temperature was increased to 140° C. during the subsequent preliminary homogenization, during which the hexane initially added as protecting liquid evaporated. The hexane was recycled. The pre-homogenized feedstock was then processed further in a shear roll extruder to the requisite microhomogeneity.

The resultant feedstock was converted into samples by metal powder injection molding. The parameters temperature, injection time, injection rate and pressure and mold time were optimized on the injection-molding machine. The resultant samples were debindered by wet-chemical and thermal means and subsequently sintered in a reducing atmosphere. The structure of these samples (FIG. 1) is virtually completely impermeable and exhibits a very good microhomogeneity for the fineness of the molybdenum powder (dark phase). Copper (pale phase) surrounds the predominantly <2 μm molybdenum particles.

Example 2

A mixture of 80% by weight of $WO_3$ and 20% by weight of CuO was dry-ground in the counterjet mill and subsequently reduced at 850° C. under dry hydrogen. In this way, a tungsten/copper composite powder having a tungsten:copper weight ratio of 80:20 was obtained. 2000 g of the tungsten/copper composite powder were subsequently stirred under nitrogen into 650 ml of hexane to which 50 g of paraffin wax had been added. During this mixing, 40 g of aluminium nitride powder (H. C. Starck, grade C) were added. In order to prepare the feedstock, a wax/polymer mixture was then added as binder in a heatable Sigma compounder. The temperature was increased to 140° C. during the subsequent preliminary homogenization, during which the hexane initially added as protection liquid evaporated. The hexane was recycled. The pre-homogenized feedstock was then further processed in a shear roll extruder to the requisite microhomogeneity.

The resultant feedstock was converted as in Example 1 into samples which have a structure which is virtually completely impermeable and exhibits very good microhomogeneity for the fineness of the tungsten powder.

Although the present invention has been described in detail with reference to certain preferred versions thereof, other variations are possible. Therefore, the spirit and scope of the appended claims should not be limited to the description of the versions contained therein.

What is claimed is:

1. A process for producing a composite component comprising:
    (a) mixing a metal composite powder with a protecting liquid in an inert atmosphere,
    (b) mixing the metal composite powder formed in step (a) with a binder and forming a system comprising the metal composite powder and the binder, and
    (c) subjecting the system to powder injection molding and forming the composite component.

2. The process according to claim 1, wherein the system subjected to powder injection molding further comprises a ceramic component.

3. The process according to claim 1, wherein the protecting liquid is selected from the group consisting of hexane, heptane, toluene, and mixtures thereof.

4. The process according to claim 1, wherein the protecting liquid comprises a wax component.

5. The process according to claim 1, wherein the composite component is selected from the group consisting of tungsten/copper composite components and molybdenum/copper composite components.

6. The process according to claim 5, wherein during the powder injection molding, a sintering step is carried out at a sintering temperature of from about 1090 to about 1300° C.

7. A process for producing a composite component comprising:
(a) producing a metal composite powder by reduction of oxides of at least two different metals with hydrogen,
(b) mixing the metal composite powder with a protecting liquid in an inert atmosphere and forming a metal composite powder product,
(c) mixing the metal composite powder product of step b) with a binder and forming a composite powder/binder mixture, and
(d) subjecting the composite powder/binder mixture to injection-molding and forming the composite component.

8. The process of claim 7, wherein the composite powder/binder mixture further comprises a ceramic component.

9. The process according to claim 7, wherein the protecting liquid is selected from the group consisting of hexane, heptane, toluene, and mixtures thereof.

10. The process according to claim 7, wherein the protecting liquid comprises a wax component.

11. The process according to claim 7, wherein the composite component is selected from the group consisting of tungsten/copper composite components and molybdenum/copper composite components.

12. The process according to claim 11, wherein during the powder injection molding, a sintering step is carried out at a sintering temperature of from about 1090 to about 1300° C.

13. The process according to claim 7, wherein the metal composite powder has a primary metal particle size of predominantly less than about 2 $\mu$m and an oxygen content that is less than about 0.8% by weight.

* * * * *